(12) United States Patent
Ellis et al.

(10) Patent No.: US 9,385,687 B2
(45) Date of Patent: Jul. 5, 2016

(54) CONFIGURABLE RADIO FREQUENCY ATTENUATOR

(71) Applicant: RF Micro Devices, Inc., Greensboro, NC (US)

(72) Inventors: Alan Leon Ellis, San Jose, CA (US); Edward Russell Franzwa, San Ramon, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 14/659,386

(22) Filed: Mar. 16, 2015

(65) Prior Publication Data

US 2016/0105159 A1 Apr. 14, 2016

Related U.S. Application Data

(60) Provisional application No. 62/061,734, filed on Oct. 9, 2014.

(51) Int. Cl.
*H03H 11/02* (2006.01)
*H03H 11/24* (2006.01)

(52) U.S. Cl.
CPC .................................. *H03H 11/245* (2013.01)

(58) Field of Classification Search
USPC ......................................... 327/308; 333/81 R
See application file for complete search history.

(56) References Cited

U.S. PATENT DOCUMENTS

| | | | | |
|---|---|---|---|---|
| 4,890,077 A * | 12/1989 | Sun | ......................... | H01P 1/227 257/277 |
| 7,205,817 B1 * | 4/2007 | Huang | ................. | H03H 11/245 327/308 |
| 8,334,718 B2 * | 12/2012 | Granger-Jones | ..... | H03H 11/245 327/308 |
| 8,386,986 B2 | 2/2013 | Granger-Jones et al. | | |
| 8,461,898 B2 | 6/2013 | Granger-Jones et al. | | |
| 8,614,597 B2 * | 12/2013 | Zhang | ................. | H03H 11/245 327/308 |
| 2006/0232357 A1 * | 10/2006 | Roldan | ................. | H01P 1/2135 333/81 A |
| 2009/0072932 A1 * | 3/2009 | Nakatani | .............. | H03H 11/245 333/81 R |

OTHER PUBLICATIONS

Araki, Y. et al., "A 0.13um CMOS 90dB Variable Gain Pre-Power Amplifier Using Robust Linear-in-dB Attenuator," IEEE Radio Frequency Integrated Circuit Symposium, 2008. RFIC 2008. pp. 673-676.
Huang, Y.Y. et al., "Highly Linear RF CMOS Variable Attenuators with Adaptive Body Biasing," IEEE Journal of Solid State Circuits, vol. 46, No. 5, May 2011, 11 pages.

* cited by examiner

*Primary Examiner* — Blane J Jackson
(74) *Attorney, Agent, or Firm* — Winthrow & Terranova, P.L.L.C.

(57) ABSTRACT

RF attenuator circuitry includes an RF attenuator and a control system. The RF attenuator is configured to provide an attenuation response between an input node and an output node. The control system is coupled to the RF attenuator and configured to adjust one or more control signals provided to the RF attenuator based on either the temperature of the circuitry or an externally applied test signal provided to the control system. The control signals are provided such that the attenuation response of the RF attenuator is substantially linear-in-dB with respect to either the temperature or the test signal provided to the control system. Because the control system is configured to adjust the control signals based either on a temperature of the circuitry or the test signal, the response of the RF attenuator can be easily and quickly tested to ensure linear-in-dB operation thereof.

20 Claims, 11 Drawing Sheets

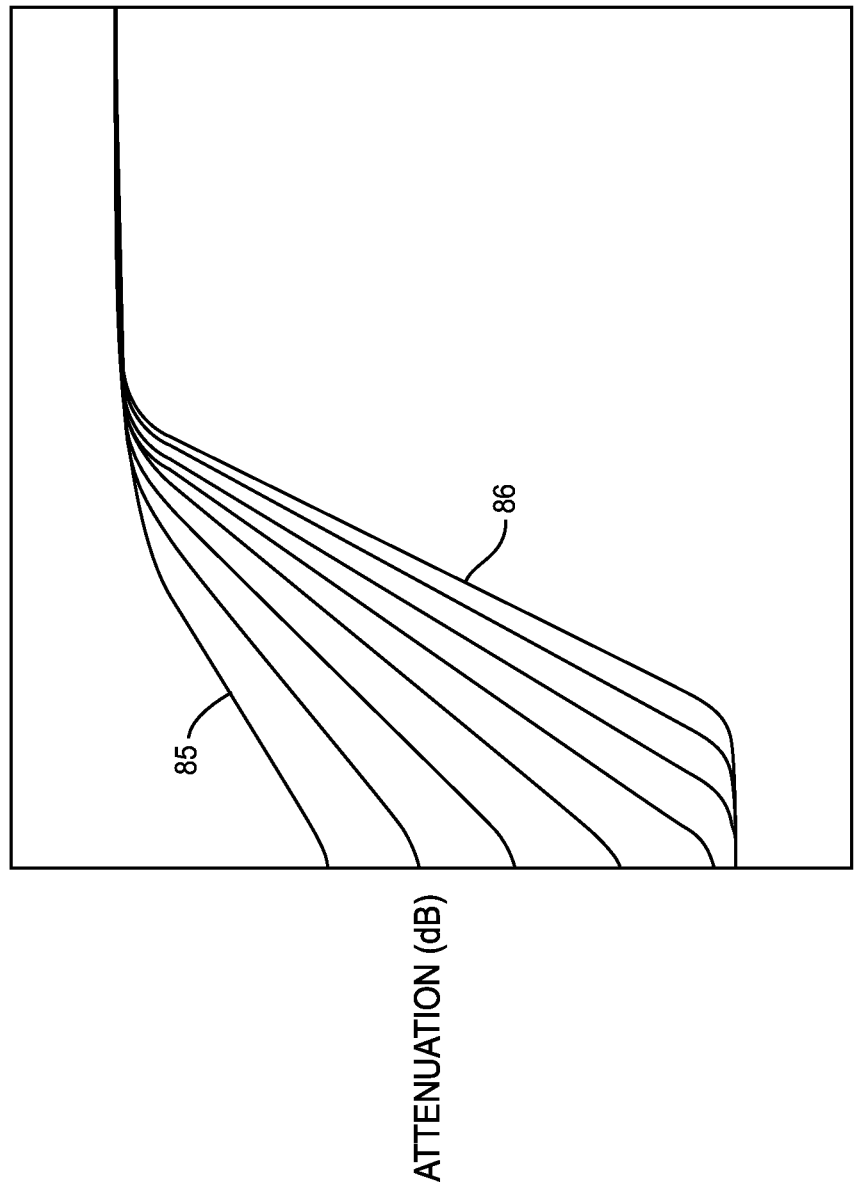

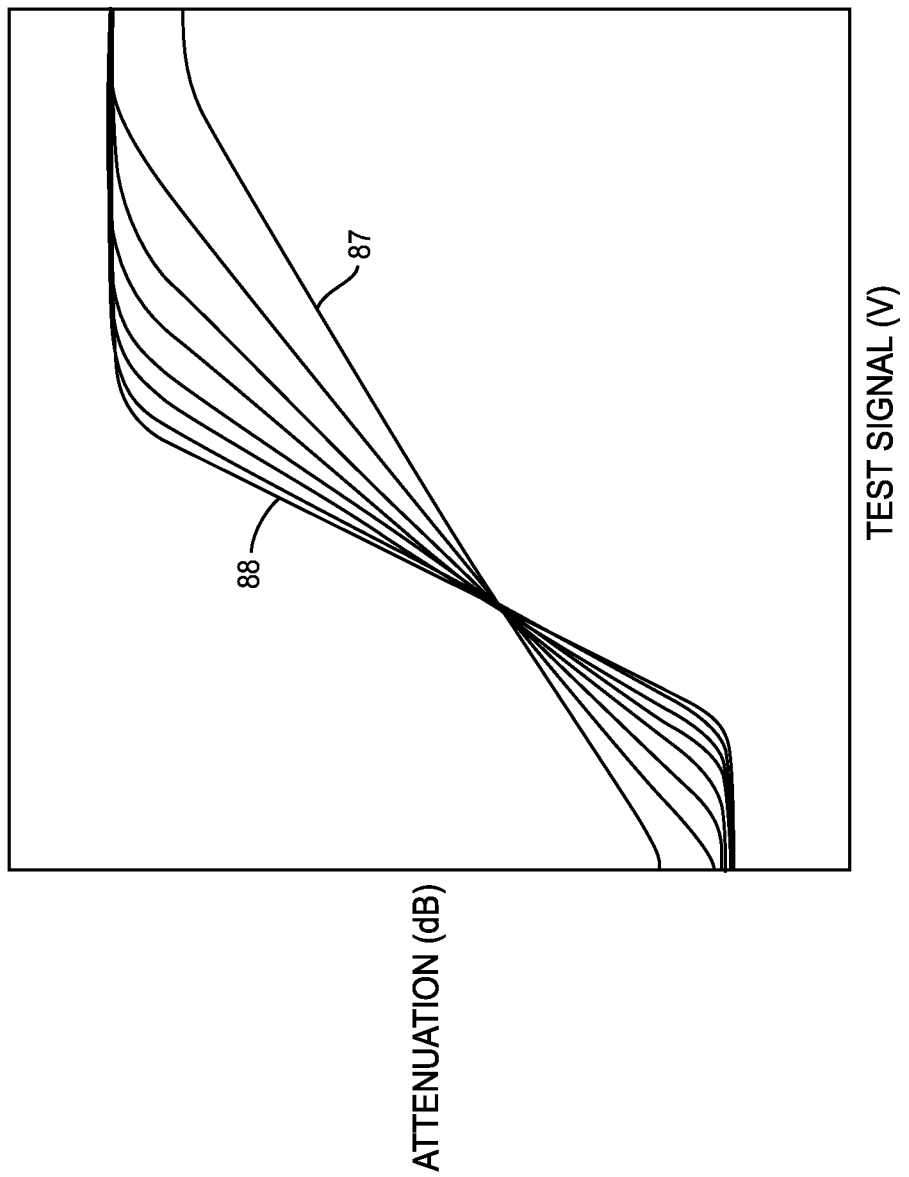

CONFIGURABLE RADIO FREQUENCY ATTENUATOR

RELATED APPLICATIONS

This application claims the benefit of U.S. provisional patent application Ser. No. 62/061,734, filed Oct. 9, 2014, the disclosure of which is incorporated herein by reference in its entirety.

FIELD OF THE DISCLOSURE

The present disclosure relates to radio frequency (RF) attenuators and control systems associated therewith.

BACKGROUND

Radio frequency (RF) attenuators are used throughout the front-end circuitry of mobile terminals. Generally, it is desirable for an RF attenuator to be precisely adjustable and capable of handling a desired amount of RF power. Further, it is often desirable for an RF attenuator to exhibit a linear attenuation response with respect to changes in temperature. Accordingly, a control system for an RF attenuator may provide biasing signals to the RF attenuator such that an attenuation response of the RF attenuator is linear-in-dB with respect to changes in temperature. Conventionally, in order to test the attenuation response of an RF attenuator with respect to temperature, the RF attenuator was exposed to a variety of temperatures and the attenuation response thereof was measured. Such a process is not only time consuming, but can also exhibit inconsistencies. Additionally, RF attenuators used with control circuitry configured to perform temperature compensation have conventionally been pi-type RF attenuators that have a relatively low power handling capability as well as inferior distortion characteristics.

Accordingly, there is a need for an RF attenuator that exhibits a linear-in-dB attenuation response with respect to temperature, can handle a desired amount of RF power, has a low level of distortion products, and is capable of expedited testing.

SUMMARY

The present disclosure relates to radio frequency (RF) attenuators and control systems associated therewith. In one embodiment, RF attenuator circuitry includes an RF attenuator and a control system. The RF attenuator is configured to provide an attenuation response between an input node and an output node. The control system is coupled to the RF attenuator and configured to adjust one or more control signals provided to the RF attenuator based on either the temperature of the circuitry or an externally applied test signal provided to the control system. The control signals are provided such that the attenuation response of the RF attenuator is substantially linear-in-dB with respect to either the temperature or the test signal provided to the control system. Because the control system is configured to adjust the control signals based either on a temperature of the circuitry or the test signal, the response of the RF attenuator can be easily and quickly tested to ensure linear-in-dB operation thereof.

In one embodiment, the RF attenuator is a tee (T) attenuator. Accordingly, the RF attenuator is capable of handling a relatively large amount of RF power and providing low levels of distortion.

In one embodiment, RF attenuator circuitry includes an RF attenuator and a control system. The RF attenuator is configured to provide an attenuation response between an input node and an output node. The control system is coupled to the RF attenuator and configured to adjust one or more control signals provided to the RF attenuator with respect to a temperature of the circuitry such that the attenuation response of the RF attenuator is substantially linear-in-dB with respect to temperature. Further, the control system is configured to receive a test signal and simulate a change in temperature of the circuitry based on the test signal in order to test the attenuation response of the RF attenuator with respect to temperature. Because the control system is configured to simulate a change in temperature of the circuitry based on the test signal, the attenuation response of the RF attenuator with respect to temperature can be quickly and easily assessed. This test signal control capability could also be used to control the attenuation as a parameter in embedded higher level system calibration or optimization routines.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

FIGS. 8A through 8D are graphs illustrating the operation of RF attenuator circuitry according to various embodiments of the present disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
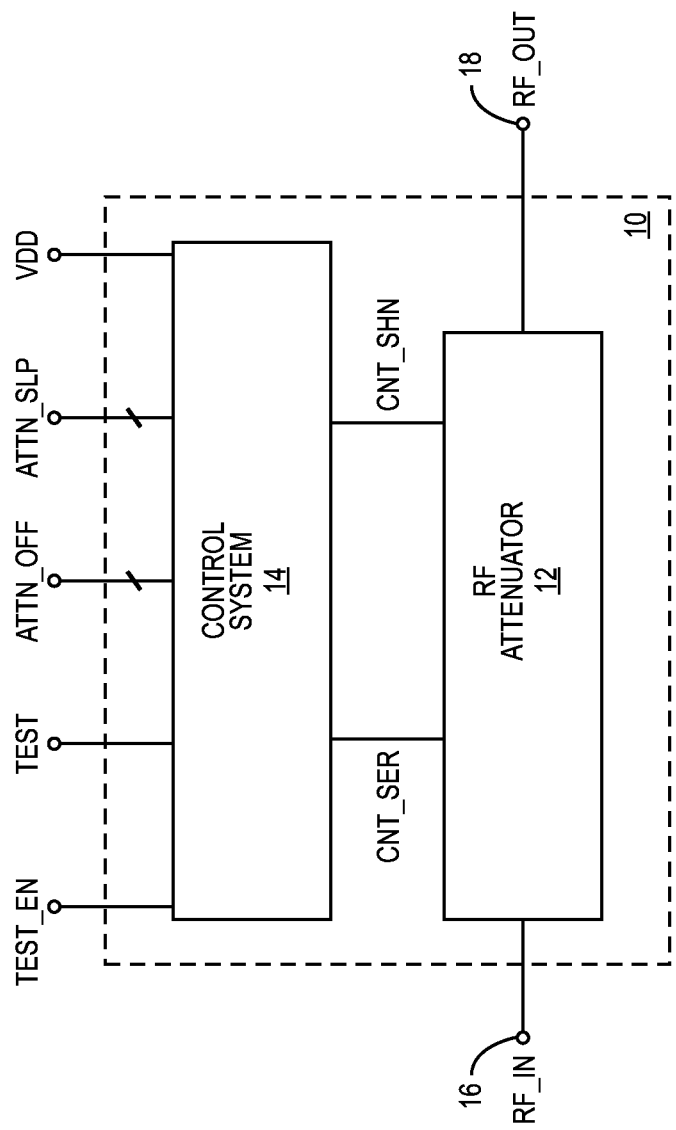
FIG. 1 shows configurable radio frequency (RF) attenuator circuitry according to one embodiment of the present disclosure.

FIG. 1 shows configurable RF attenuator circuitry 10 according to one embodiment of the present disclosure. The configurable RF attenuator circuitry 10 includes an RF attenuator 12 and a control system 14. The RF attenuator 12 includes an input node 16 and an output node 18, which are configured to receive an RF input signal RF_IN and provide an attenuated RF output signal RF_OUT, respectively. The control system 14 is coupled to the RF attenuator 12 and configured to receive a test-mode enable signal TEST_EN, a test signal TEST, an attenuation offset control signal ATTN_OFF, an attenuation slope control signal ATTN_SLP, and a supply voltage VDD and provide a serial control signal CNT_SER and a shunt control signal CNT_SHN to the RF attenuator 12. As discussed in further detail below, the serial control signal CNT_SER and the shunt control signal CNT_SHN are provided such that an attenuation response of the RF attenuator 12 between the input node 16 and the output node 18 remains substantially linear-in-dB with respect to a temperature of the configurable RF attenuator circuitry 10 or a magnitude of the test signal TEST provided to the control system 14. The attenuation offset control signal ATTN_OFF and the attenuation slope control signal ATTN_SLP may control an offset of the attenuation response and a slope of the attenuation response as it relates to the temperature of the configurable RF attenuator circuitry 10 or the test signal TEST, respectively. The test-mode enable signal TEST_EN and the test signal TEST may be used to test the functionality of the configurable RF attenuator circuitry 10. Specifically, the control system 14 may use the test signal TEST to simulate a change in temperature of the configurable RF attenuator circuitry 10 in order to quickly characterize the relationship between the attenuation response of the RF attenuator 12 and the temperature of the configurable RF attenuator circuitry 10, as discussed in further detail below.

Figure 2:
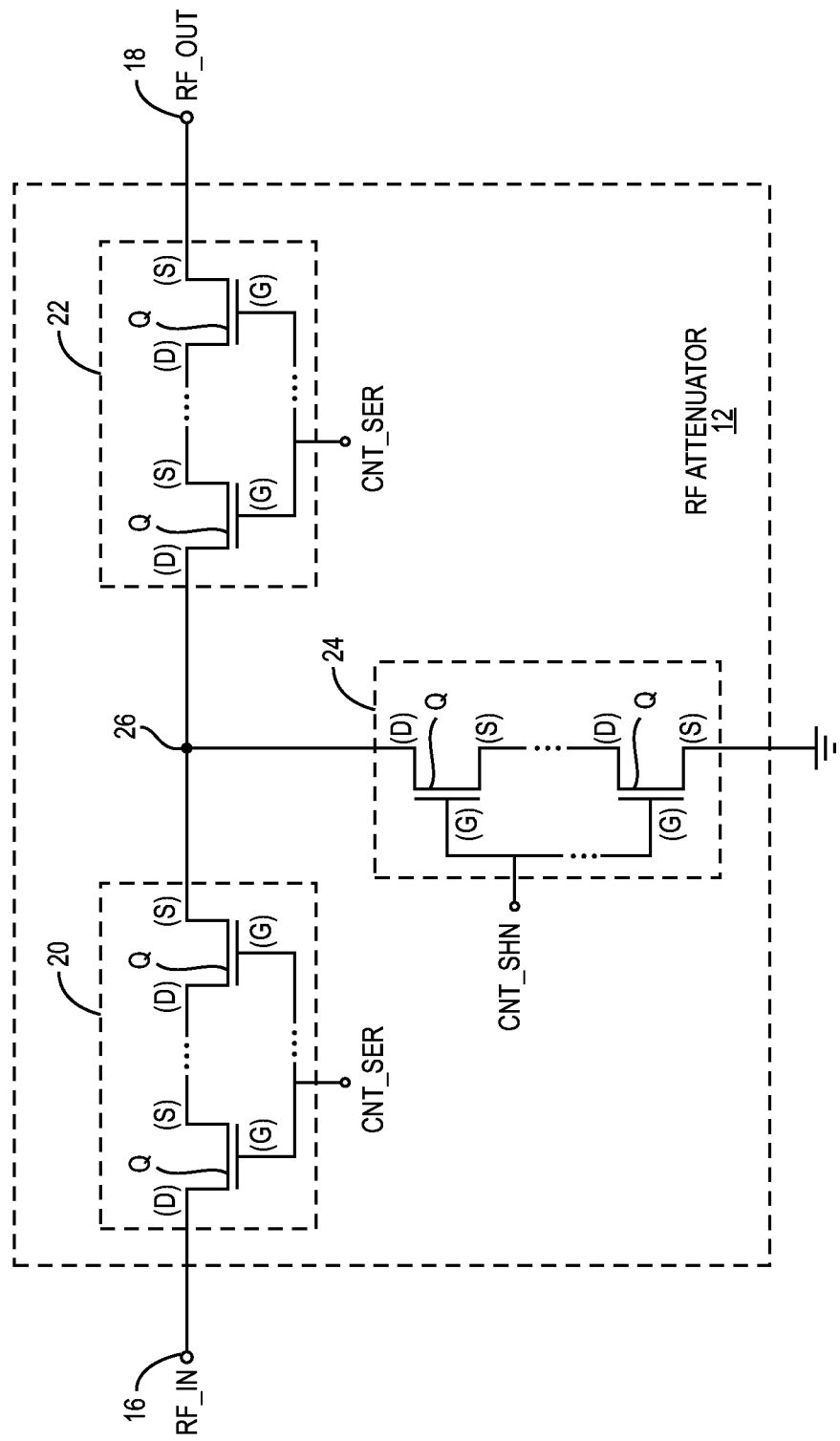
FIG. 2 shows an RF attenuator according to one embodiment of the present disclosure.

FIG. 2 shows details of the RF attenuator 12 according to one embodiment of the present disclosure. As shown in FIG. 2, the RF attenuator 12 is a T-type attenuator including a first series field-effect transistor (FET) element 20, a second series FET element 22, and a shunt FET element 24. The first series FET element 20 is coupled between the input node 16 and an intermediate node 26. The second series FET element 22 is coupled between the intermediate node 26 and the output node 18. The shunt FET element 24 is coupled between the intermediate node 26 and ground. Notably, each one of the first series FET element 20, the second series FET element 22, and the shunt FET element 24 may include any number of stacked FETs Q coupled in series. Specifically, each one of the FETs Q may include a gate contact (G), a drain contact (D), and a source contact (S). The drain contact (D) of each one of the FETs Q is coupled to the source contact (S) of the next one of the FETs Q in the stack. The gate contacts (G) of each one of the FETs Q are coupled together in order to form a control node. To control the RF attenuator 12, the series control signal CNT_SER is delivered to the first series FET element 20 and the second series FET element 22, while the shunt control signal CNT_SHN is delivered to the shunt FET element 24. Generally, the larger the number of FETs Q in each one of the first series FET element 20, the second series FET element 22, and the shunt FET element 24, the higher the power handling capability of the RF attenuator 12. Accordingly, an appropriate number of FETs Q may be chosen for each one of the first series FET element 20, the second series FET element 22, and the shunt FET element 24 based on the desired power handling capability of the RF attenuator 12. Because the RF attenuator 12 is a T-type attenuator, the RF attenuator 12 can generally handle more RF power and creates less distortion with less FETs Q than a pi-type attenuator conventionally used in temperature compensated RF attenuator circuitry.

Figure 3:
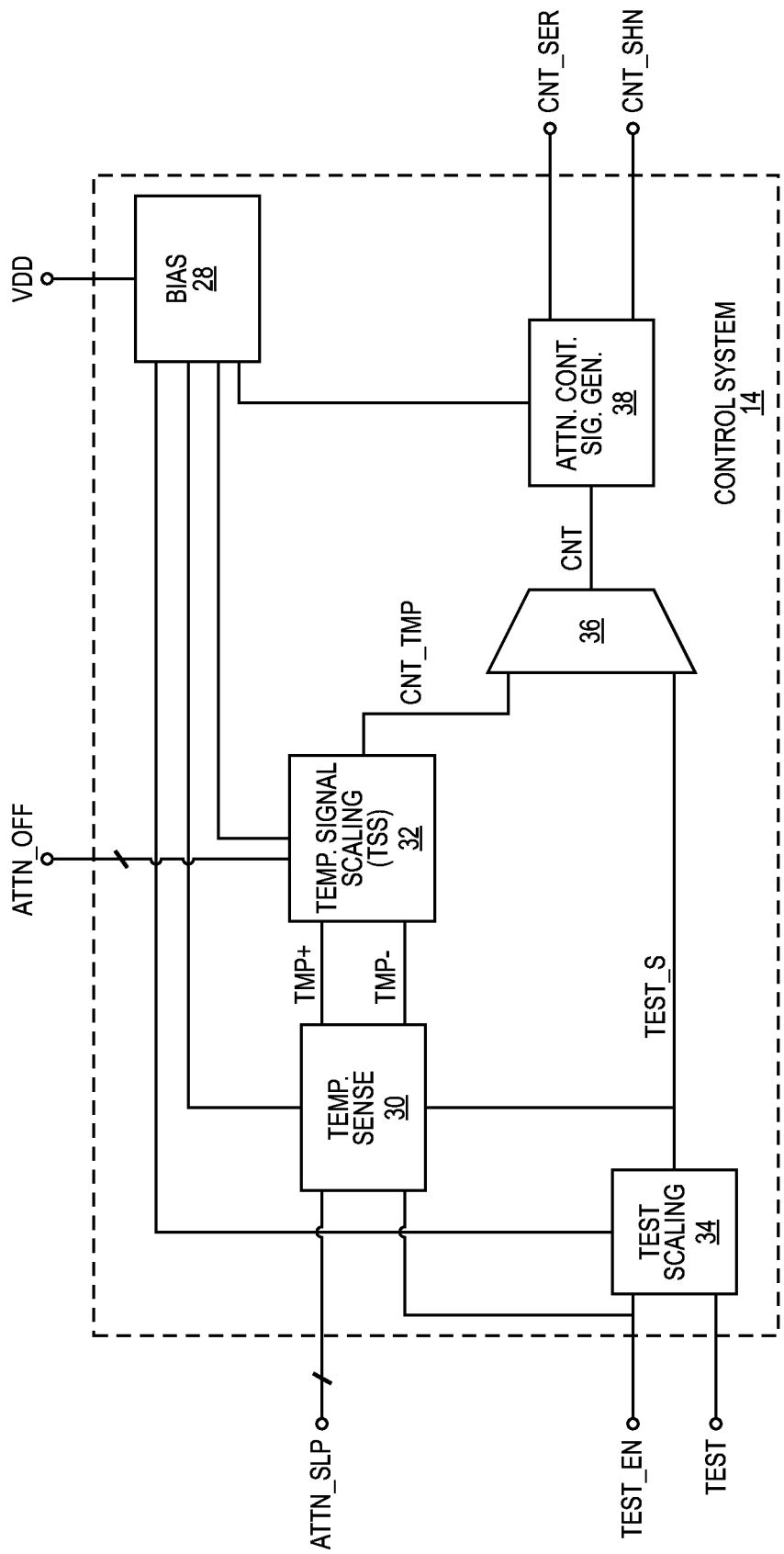
FIG. 3 shows control circuitry for an RF attenuator according to one embodiment of the present disclosure.

FIG. 3 shows details of the control system 14 according to one embodiment of the present disclosure. The control system 14 includes bias circuitry 28, temperature sensing circuitry 30, temperature signal scaling (TSS) circuitry 32, test signal scaling circuitry 34, an analog multiplexer 36, and attenuator control signal generation circuitry 38. The bias circuitry 28 is configured to receive a supply voltage VDD and generate a number of bias signals including a proportional to absolute temperature (PTAT) bias signal and a constant bias signal, as will be discussed in detail below. The temperature sensing circuitry 30 is configured to sense a temperature of the configurable RF attenuator circuitry 10 and provide a differential temperature signal TMP to the TSS circuitry 32. Further, the temperature sensing circuitry 30 receives a scaled version of the test signal TEST_S from the test signal scaling circuitry 34 and may simulate a change in temperature of the configurable RF attenuator circuitry 10 based on the scaled version of the test signal TEST_S. The temperature sensing circuitry 30 may also receive the attenuator slope control signal ATTN_SLP and make one or more adjustments to the differential temperature signal TMP in order to produce a desired relationship between the attenuation response of the RF attenuator 12 and the temperature of the configurable RF attenuator circuitry 10, as discussed in detail below.

The TSS circuitry 32 scales the differential temperature signal TMP based on the attenuation offset control signal ATTN_OFF and converts the signal into a single-ended temperature control signal CNT_TMP. The test signal scaling circuitry 34 performs any necessary scaling of the test signal TEST in order to provide a scaled test signal TEST_S, which is delivered to both the temperature sensing circuitry 30 and the analog multiplexer 36. The analog multiplexer 36 receives the scaled test signal TEST_S and the temperature control signal CNT_TMP and provides a multiplexed control signal CNT to the attenuator control signal generation circuitry 38.

The attenuator control signal generation circuitry 38 receives the multiplexed control signal CNT and provides the series control signal CNT_SER and the shunt control signal CNT_SHN such that the attenuation response of the RF attenuator 12 remains linear-in-dB with either the temperature of the configurable RF attenuator circuitry 10 or a magnitude of the test signal TEST. In a standard mode of operation, the control system 14 provides the series control signal CNT_SER and the shunt control signal CNT_SHN such that the attenuation response of the RF attenuator 12 is linear-in-dB with respect to the temperature of the configurable RF attenuator circuitry 10, as measured by the temperature sensing circuitry 30. In a test mode of operation, which is enabled by the test enable signal TEST_EN, the control system 14 provides the series control signal CNT_SER and the shunt control signal CNT_SHN such that the attenuation response of the RF attenuator 12 is linear-in-dB with respect to the magnitude of the test signal TEST, which simulates a particular temperature of the configurable RF attenuator circuitry 10. Accordingly, in the test mode of operation of the configurable RF attenuator circuitry 10, the linearity of the attenuation response of the RF attenuator 12 can be quickly and accurately assessed by varying the test signal TEST over a desired range of values and measuring the attenuation response of the RF attenuator 12.

Notably, the control system 14 shown in FIG. 3 is only an exemplary embodiment thereof. Those of ordinary skill in the art will appreciate that the functional objectives of the control system 14 may be carried out in any number of ways, all of which are contemplated herein.

Figure 4:
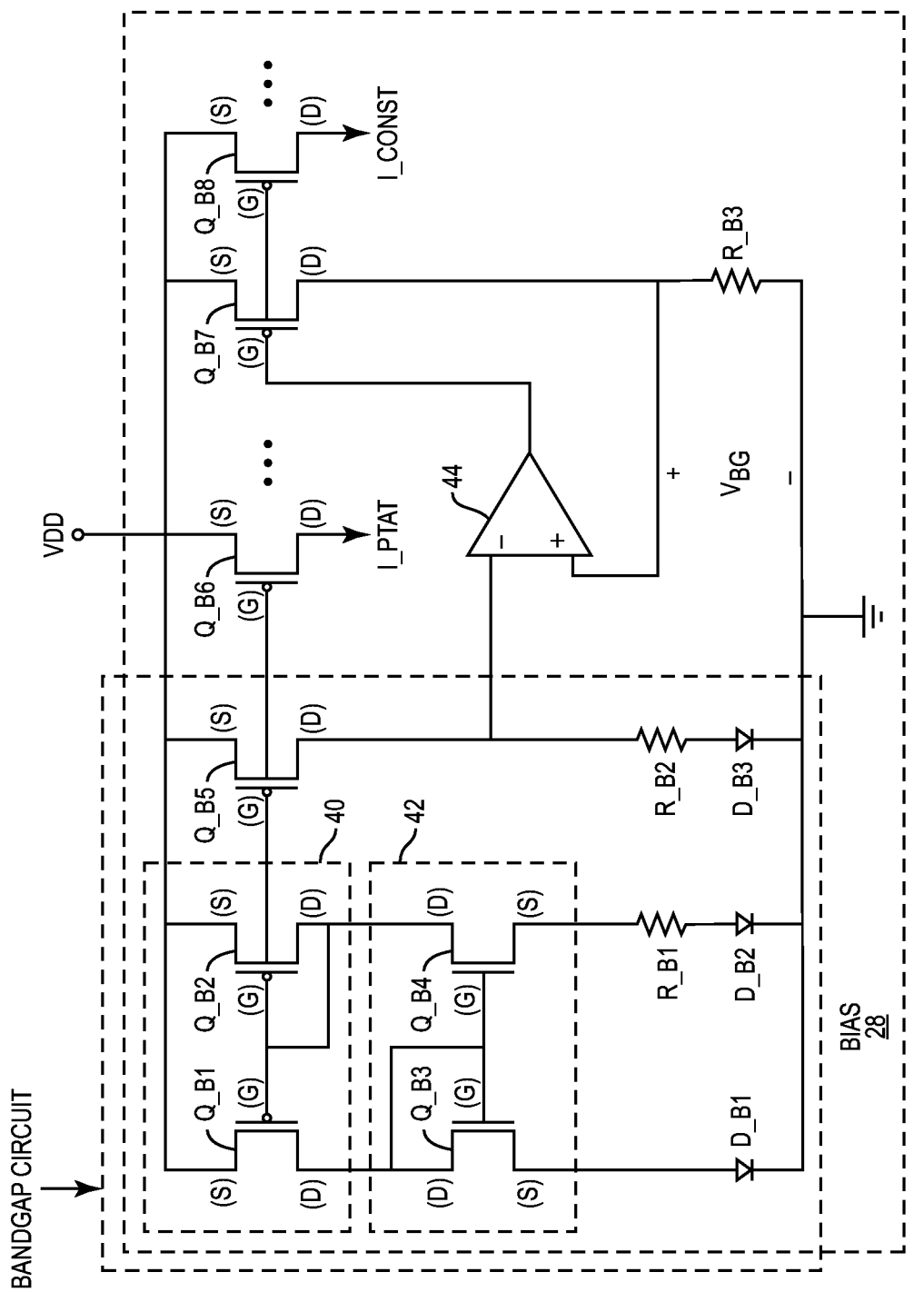
FIG. 4 shows bias circuitry according to one embodiment of the present disclosure.

FIG. 4 shows details of the bias circuitry 28 according to one embodiment of the present disclosure. The bias circuitry 28 includes a first bias circuitry current mirror 40, which includes a first bias circuitry FET Q_B1 having a source contact (S) coupled to the supply voltage VDD, a drain contact (D), and a gate contact (G) and a second bias circuitry FET Q_B2 having a source contact (S) coupled to the supply voltage VDD, a drain contact (D), and a gate contact (G) coupled to the drain contact (D) and the gate contact (G) of the first bias circuitry FET Q_B1. A second bias circuitry current mirror 42 is coupled to the first bias circuitry current mirror 40. The second bias circuitry current mirror 42 includes a third bias circuitry FET Q_B3 with a drain contact (D) coupled to the drain contact (D) of the first bias circuitry FET Q_B1, a source contact (S), and a gate contact (G) coupled to the drain contact (D) and a fourth bias circuitry FET Q_B4 with a drain contact (D) coupled to the drain contact (D) of the second bias circuitry FET Q_B2, a source contact (S), and a gate contact (G) coupled to the gate contact (G) of the third bias circuitry FET Q_B3. A first bias circuitry diode D_B1 includes an anode coupled to the source contact (S) of the third bias circuitry FET Q_B3 and a cathode coupled to ground. A first bias circuitry resistor R_B1 is coupled between the source contact (S) of the fourth bias circuitry FET Q_B4 and an anode of a second bias circuitry diode D_B2. A cathode of the second bias circuitry diode D_B2 is coupled to ground. A fifth bias circuitry FET Q_B5 includes a source contact (S) coupled to the supply voltage VDD, a drain contact (D), and a gate contact (G) coupled to the gate contact (G) of the second bias circuitry FET Q_B2. A sixth bias circuitry FET Q_B6 includes a source contact (S) coupled to the supply voltage VDD, a drain contact (D) configured to supply a PTAT current I_PTAT, and a gate contact (G) coupled to a gate contact (G) of the fifth bias circuitry FET Q_B5. Additional FET circuitry as described for FET Q_B6 can be included to produce additional I_PTAT current outputs as needed for implementing the control system 14.

A second bias circuitry resistor R_B2 is coupled between the drain contact (D) of the fifth bias circuitry FET Q_B5 and an anode of a third bias circuitry diode D_B3. A cathode of the third bias circuitry diode D_B3 is coupled to ground. The resulting voltage potential at the drain contact (D) of the fifth bias circuitry FET Q_B5 is the semiconductor material bandgap voltage. A bias circuitry operational amplifier 44 includes an inverting input coupled to the drain contact (D) of the fifth bias circuitry FET Q_B5, a non-inverting input coupled to ground through a third bias circuitry resistor R_B3, and an output. A seventh bias circuitry transistor Q_B7 includes a source contact (S) coupled to the supply voltage VDD, a drain contact (D) coupled to ground though the third bias circuitry resistor R_B3, and a gate contact (G) coupled to the output of the bias circuitry operational amplifier 44. The bias circuitry operational amplifier 44 will drive the gate of the seventh bias circuitry transistor Q_B7 to generate a drain current through the seventh bias circuitry transistor Q_B7 to a value which, when multiplied by the resistance value of the third bias circuitry resistor R_B3, will result in a voltage potential ($V_{BG}$) equal to the semiconductor material bandgap voltage. An eighth bias circuitry FET Q_B8 includes a source contact (S) coupled to the supply voltage VDD, a drain contact (D) configured to provide a constant current I_CONST, and a gate contact (G) coupled to the gate contact (G) of the seventh bias circuitry FET Q_B7. Additional FET circuitry as described for FET Q_B8 can be included to produce additional constant current I_CONST outputs as needed for implementing the control system 14.

In operation, the bias circuitry 28 is configured to provide the PTAT current I_PTAT according to Equation (1):

$$I_{PTAT} = \left(\frac{V_T}{R\_B1}\right)\ln(n) \quad (1)$$

where $I_{PTAT}$ is the PTAT current and $V_T$ is the thermal voltage (KT/q) where K is Boltzmann's constant, T is the temperature in Kelvin, q is the electron charge constant, and n is the area ratio of diodes D_B2 and D_B1. The second bias circuitry diode D_B2 may be scaled in size with respect to the first bias circuitry diode D_B1 and the third bias circuitry diode D_B3 such that the second bias circuitry diode D_B2 is about six times bigger than the first bias circuitry diode D_B1 and the third bias circuitry diode D_B3. The bias circuitry 28 is further configured to provide the constant current I_CONST according to Equation (2):

$$I_{CONST} = \frac{\left(\frac{R\_B2}{R\_B1}\right)V_T\ln(n) + V_{D\_B3}}{R\_B3} = \frac{V_{BG}}{R\_B3} \quad (2)$$

where $I_{CONST}$ is the constant current, $V_T$ is the thermal voltage, $V_{D\_B3}$ is the voltage across the third bias circuitry diode D_B3, and n is the ratio of the area of the second bias circuitry diode D_B2 to the area of the first bias circuitry diode D_B1.

Notably, the bias circuitry 28 shown in FIG. 4 is only an exemplary embodiment thereof. Those of ordinary skill in the art will appreciate that the functional objectives of the bias circuitry 28 may be carried out in any number of ways, all of which are contemplated herein.

Figure 5:
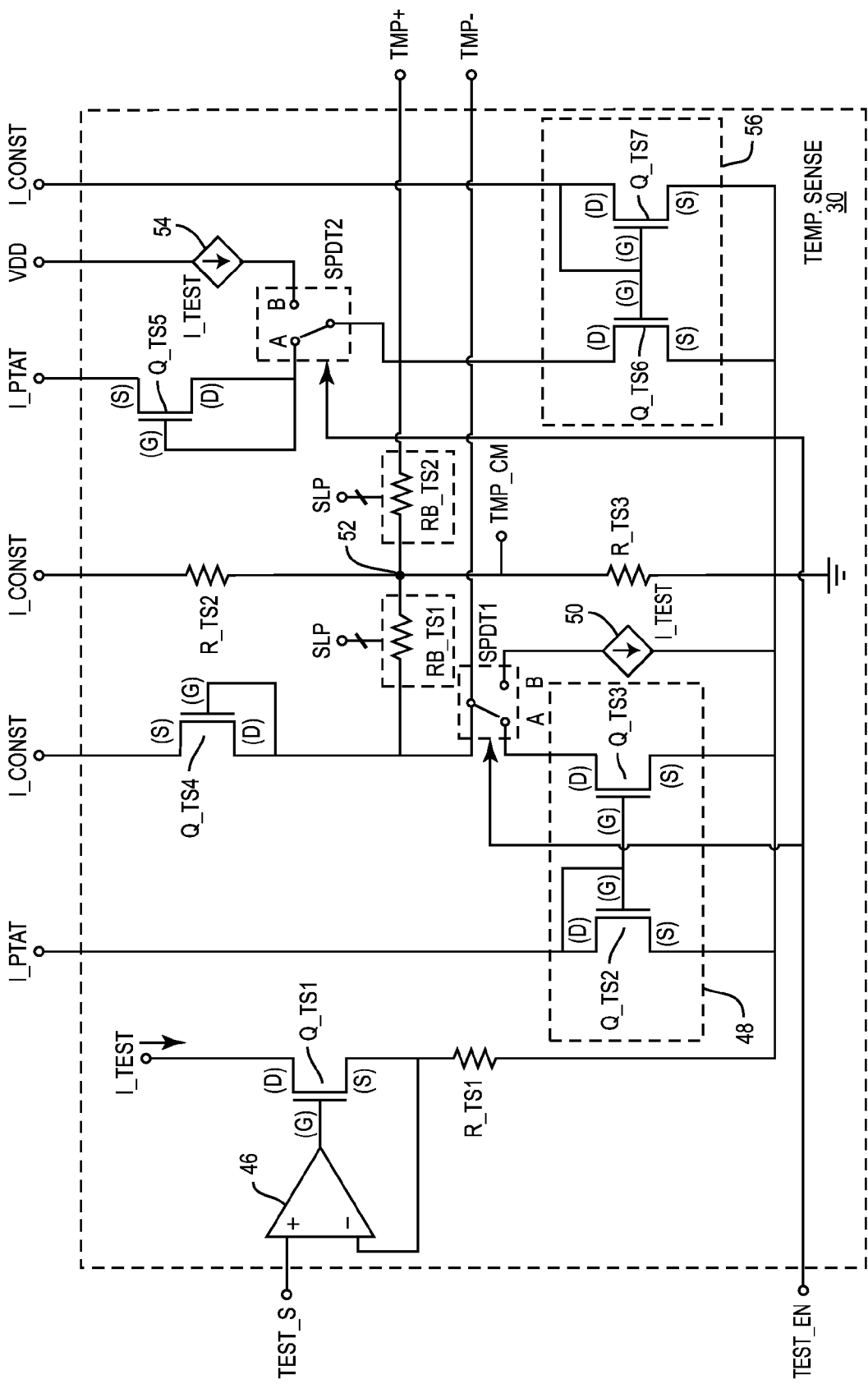
FIG. 5 shows temperature sensing circuitry according to one embodiment of the present disclosure.

FIG. 5 shows details of the temperature sensing circuitry 30 according to one embodiment of the present disclosure. The temperature sensing circuitry 30 includes a temperature sensing operational amplifier 46 including a non-inverting input configured to receive a scaled version of the test signal TEST_S from the test signal scaling circuitry 34, a non-inverting input coupled to ground via a first temperature sensing resistor R_TS1, and an output. A first temperature sensing FET Q_TS1 includes a drain contact (D) configured to generate a test current I_TEST which is linear with respect to the scaled test signal TEST_S where $$I\_TEST = \frac{V_{TEST\_S}}{R\_TS1},$$

a gate contact (G) coupled to the output of the temperature sensing operational amplifier 46, and a source contact (S) coupled to ground via the first temperature sensing resistor R_TS1. A first temperature sensing current mirror 48 includes a second temperature sensing FET Q_TS2 including a drain contact (D) configured to receive the PTAT current I_PTAT from the bias circuitry 28, a gate contact (G) coupled to the drain contact (D), and a source contact (S) coupled to ground and a third temperature sensing FET Q_TS3 including a drain contact (D), a gate contact (G) coupled to the gate contact (G) of the second temperature sensing FET Q_TS2, and a source contact (S) coupled to ground. A fourth temperature sensing FET Q_TS4 includes a source contact (S) configured to receive the constant current I_CONST from the bias circuitry 28, a gate contact (G), and a drain contact (D) coupled to the gate contact (G) and to the common arm of a first temperature sensing switch SPDT1. The common arm of the first temperature sensing switch SPDT1 also forms an output for the negative portion TMP− of the differential temperature signal TMP. The first temperature sensing switch SPDT1 includes a first output A coupled to the drain contact (D) of the third temperature sensing FET Q_TS3 and a second output B coupled to a test current sink 50. The second terminal of the test current sink 50 is coupled to ground. The first temperature sensing switch SPDT1 is controlled by the test enable signal TEST_EN. The first output A of the first temperature sensing switch SPDT1 is enabled for normal operation of the system and the second output B of the first temperature sensing switch SPDT1 is enabled for a test mode of the system.

A second temperature sensing resistor R_TS2 is coupled between a reference current I_CONST and an intermediate node 52. A third temperature sensing resistor R_TS3 is coupled between the intermediate node 52 and ground. A first temperature sensing discretely adjustable resistor RB_TS1 is coupled between the drain contact (D) of the fourth temperature sensing FET Q_TS4 and the intermediate node 52. A fifth temperature sensing FET Q_TS5 includes a source contact (S) configured to receive the PTAT current I_PTAT from the bias circuitry 28, a gate contact (G), and a drain contact (D) coupled to the gate contact (G). A second temperature sensing discretely adjustable resistor RB_TS2 is coupled between the intermediate node 52 and the common arm of a second temperature sensing switch SPDT2. The common arm of the second temperature sensing switch SPDT2 also forms an output for the positive portion TMP+ of the differential temperature signal TMP. The second temperature sensing switch SPDT2 includes a first output A coupled to the drain contact (D) of the fifth temperature sensing FET Q_TS5 and a second output B coupled to a test current source 54 respectively. The second terminal of the test current source 54 is coupled to supply voltage VDD. The second temperature sensing switch SPDT2 is also controlled by the test enable signal TEST_EN such that in a normal mode of operation of the system the first output A is enabled and for a test mode of the system the second output B is enabled.

A second temperature sensing current mirror 56 includes a sixth temperature sensing FET Q_TS6 with a drain contact (D) coupled to the common arm of the second temperature sensing switch SPDT2, a gate contact (G) and a source contact (S) coupled to ground and a seventh temperature sensing FET Q_TS7 with a drain contact (D) configured to receive the constant current I_CONST from the bias circuitry 28, a gate contact (G) coupled to the drain contact (D) and the gate contact (G) of the sixth temperature sensing FET Q_TS6, and a source contact (S) coupled to ground. The voltage across the third temperature sensing resistor R_TS3 may be referred to as the common mode of temperature signal TMP_CM.

In operation, the temperature sensing circuitry 30 acts as an "H bridge" wherein the PTAT current I_PTAT is compared to the constant current I_CONST, thereby creating a differential current which flows through the first temperature sensing discretely adjustable resistor RB_TS1 and the second temperature sensing discretely adjustable resistor RB_TS2 to create the differential temperature signal TMP. Specifically, when the PTAT current I_PTAT and the constant current I_CONST are equal, a differential current equal to zero will flow through both of the first temperature sensing discretely adjustable RB_TS1 and the second temperature sensing discretely adjustable resistor RB_TS2 to ground, such that the positive portion TMP+ of the differential temperature signal TMP and the negative portion TMP− of the differential temperature signal TMP are equal to zero. However, an imbalance between the PTAT current I_PTAT and the constant current I_CONST, which will occur as the temperature of the configurable RF attenuator circuitry 10 changes, causes a resulting amount of differential current to flow through both the first temperature sensing discretely adjustable resistor RB_TS1 and the second temperature sensing discretely adjustable resistor RB_TS2. Accordingly, the positive portion TMP+ of the differential temperature signal TMP and the negative portion TMP− of the differential temperature signal TMP will change with the same magnitude but opposite polarity centered around the common mode temperature signal TMP_CM at the intermediate node 52. The differential temperature signal TMP is provided according to Equation (3):

$$V_{TMP} = \left[\left(\frac{V_T}{R\_B1}\right)\ln(n) - \frac{V_{BG}}{R\_B3}\right](RB\_TS1 + RB\_TS2) \quad (3)$$

where $V_{TMP}$ is the voltage of the differential temperature signal TMP and n is the ratio of the area of the second bias circuitry diode D_B2 to the area of the first bias circuitry diode D_B1. Resistors R_B1 and R_B3 are defined in the bias circuitry 28. The common mode temperature signal TMP_CM is provided according to Equation (4):

$$V_{TMP\_CM} = \left(\frac{V_{BG}}{R\_B3}\right)R\_TS3 \quad (4)$$

where $V_{TMP\_CM}$ is the voltage of the common mode temperature signal TMP_CM.

When the scaled test signal TEST_S is provided to the temperature sensing operational amplifier 46 and the TEST_EN signal is enabled to change the state of the first temperature sensing switch SPDT1 and the second temperature sensing switch SPDT2, the first temperature sensing FET Q_TS1 will generate a linear test current as described above which is then mirrored to create the current provided by the test current sink 50 and the current provided by the test current source 54, respectively, which alter the differential temperature signal TMP in order to simulate a change in temperature of the configurable RF attenuator circuitry 10 and thereby test its functionality.

The attenuation slope adjustment control signal ATTN_SLP is provided to the first temperature sensing discretely adjustable resistor RB_TS1 and the second temperature sensing discretely adjustable resistor RB_TS2 in order to adjust the resistance thereof. The attenuation slope adjustment control signal ATTN_SLP may be a multi-bit binary signal in some embodiments. Adjusting the first temperature sensing discretely adjustable resistor RB_TS1 and the second temperature sensing discretely adjustable resistor RB_TS2 using the attenuation slope adjustment signal effectively changes the total resistance between the positive terminal TMP+ of the differential temperature signal TMP and the negative terminal TMP− of the differential temperature signal TMP, thereby changing the slope of the relationship between the attenuation response of the RF attenuator 12 and the temperature of the configurable RF attenuator circuitry 10 as discussed in further detail below. Those of ordinary skill in the art will readily understand that there are many different implementations possible for the first temperature sensing discretely adjustable resistor RB_TS1 and the second temperature sensing discretely adjustable resistor RB_TS2. These different discretely adjustable resistors, such as binary weighted resistors, are well known, and thus the details of the discretely adjustable resistors are omitted for the sake of brevity.

Notably, the temperature sensing circuitry 30 shown in FIG. 5 is only an exemplary embodiment thereof. Those of ordinary skill in the art will appreciate that the functional objectives of the temperature sensing circuitry 30 may be carried out in any number of ways, all of which are contemplated herein. Any reference to the term 'temperature sensing' to describe the elements contained in the temperature sensing circuitry 30 is only to connect the elements to this specific circuitry block and not to denote that the elements are sensing the temperature of the circuitry.

Figure 6:
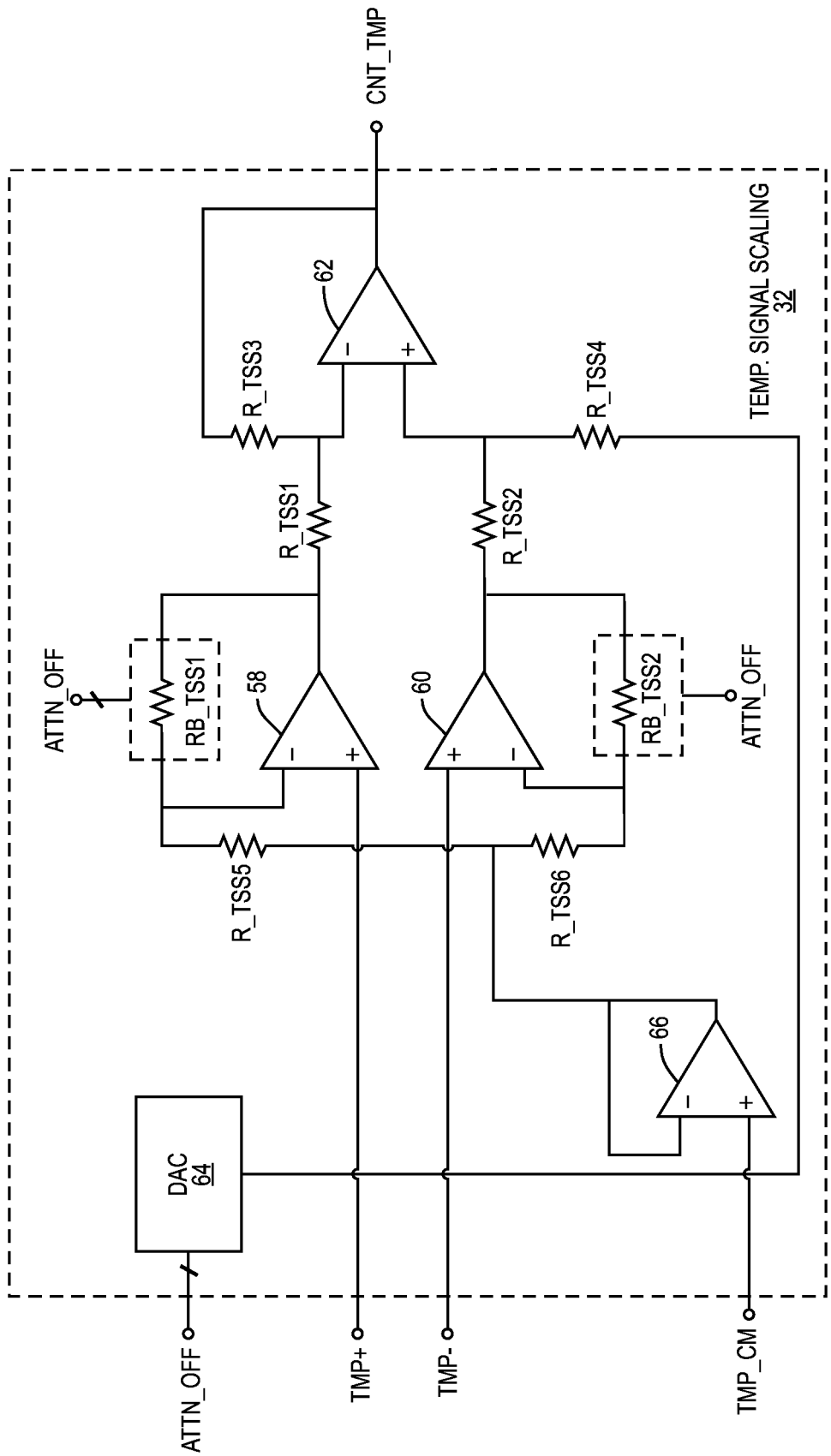
FIG. 6 shows temperature signal scaling circuitry according to one embodiment of the present disclosure.

FIG. 6 shows details of the temperature signal scaling (TSS) circuitry 32 according to one embodiment of the present disclosure. The TSS circuitry 32 includes a first TSS operational amplifier 58 with a non-inverting input configured to receive the positive portion TMP+ of the differential temperature signal TMP from the temperature sensing circuitry 30, an inverting input, and an output coupled to the inverting input via a first TSS discretely adjustable resistor RB_TSS1. A second TSS operational amplifier 60 includes a non-inverting input configured to receive the negative portion TMP− of the differential temperature signal TMP from the temperature sensing circuitry 30, an inverting input, and an output coupled to the inverting input via a second TSS discretely adjustable resistor RB_TSS2. A third TSS operational amplifier 62 includes an inverting input coupled to the output of the first TSS operational amplifier 58 via a first TSS resistor R_TSS1, a non-inverting input coupled to the output of the second TSS operational amplifier 60 via a second TSS resistor R_TSS2, and an output coupled to the inverting input via a third TSS resistor R_TSS3. The output of the third TSS operational amplifier 62 also forms an output for the temperature control signal CNT_TMP. An attenuator offset digital-to-analog converter (DAC) 64 is coupled to the non-inverting input of the third TSS operational amplifier 62 via a fourth TSS resistor R_TSS4. A fourth TSS operational amplifier 66 includes a non-inverting input configured to receive the common mode temperature signal TMP_CM from the temperature sensing circuitry 30, an inverting input, and an output coupled to the inverting input, the inverting input of the first TSS operational amplifier 58 via a fifth TSS resistor R_TSS5, and the inverting input of the second TSS operational amplifier 60 via a sixth TSS resistor R_TSS6.

In operation, the differential temperature signal TMP is received by the TSS circuitry 32 and converted into the single-ended temperature control signal CNT_TMP. The attenuator offset DAC 64 receives the attenuator offset control signal ATTN_OFF and provides an analog signal to the non-inverting input of the third TSS operational amplifier 62 via the fourth TSS resistor R_TSS4 in order to alter the magnitude of the temperature control signal CNT_TMP, which in turn changes the series control signal CNT_SER and the shunt control signal CNT_SHN provided to the RF attenuator by the attenuator control signal generation circuitry 38. Accordingly, an offset between the attenuation response of the RF attenuator 12 and the temperature of the configurable RF attenuator circuitry 10 can be controlled. The attenuator offset control signal ATTN_OFF is provided to the first TSS discretely adjustable resistor RB_TSS1 and the second TSS discretely adjustable resistor RB_TSS2, which controls the resistance thereof in order to individually adjust the operating characteristics of the first TSS operational amplifier 58 and the second TSS operational amplifier 60. Accordingly, the attenuation offset control signal ATTN_OFF adjusts the temperature control signal CNT_TMP, which in turn changes the series control signal CNT_SER and the shunt control signal CNT_SHN in order to change the relationship between the attenuation response of the RF attenuator 12 and the temperature of the configurable RF attenuator circuitry 10 which is further adjusted in the TSS circuitry 32. The temperature control signal CNT_TMP is therefore provided as described in Equation (5):

$$V_{CNT\_TMP} = -\left(\frac{R_A}{R_B}\right)\left(1 + \frac{R_C}{R_D}\right)V_{TMP} + V_{DAC} \quad (5)$$

where $V_{CNT\_TMP}$ is the voltage of the temperature control signal CNT_TMP, $R_A$ is the value of the third TSS resistor R_TSS3 and the fourth TSS resistor R_TSS4 (which have the same value), $R_B$ is the value of the first TSS resistor R_TSS1 and the second TSS resistor R_TSS2 (which have the same value), $R_C$ is the value of the first TSS discretely adjustable resistor RB_TSS1 and the second TSS discretely adjustable resistor RB_TSS2 (which have the same value), and $R_D$ is the value of the fifth TSS resistor R_TSS5 and the sixth TSS resistor R_TSS6 (which have the same value).

Notably, the TSS circuitry 32 shown in FIG. 6 is only an exemplary embodiment thereof. Those of ordinary skill in the art will appreciate that the functional objectives of the TSS circuitry 32 may be carried out in any number of ways, all of which are contemplated herein.

Figure 7:
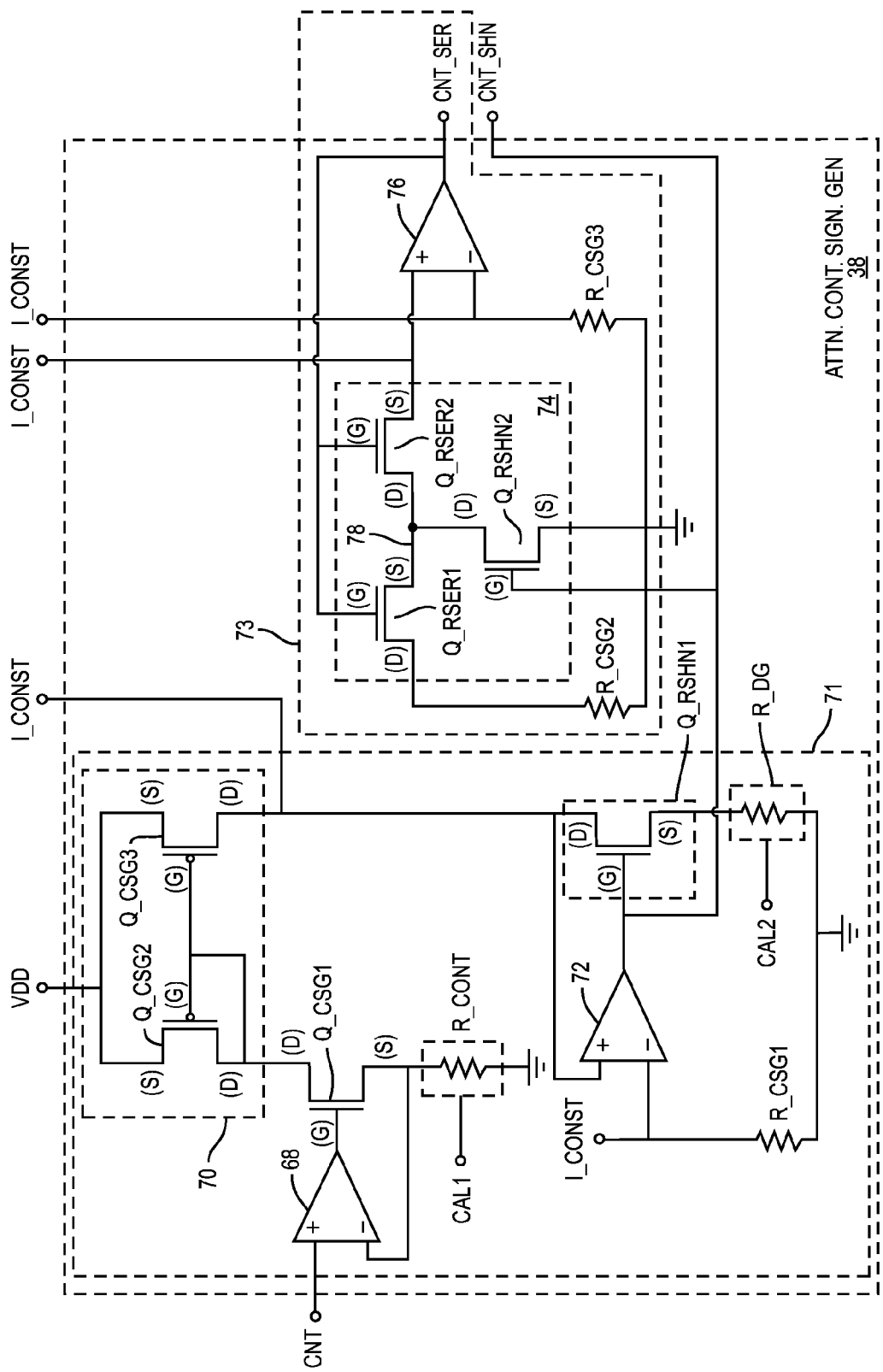
FIG. 7 shows RF attenuator control signal generation circuitry according to one embodiment of the present disclosure.

FIG. 7 shows details of the attenuator control signal generation circuitry 38 according to one embodiment of the present disclosure. The attenuator control signal generation circuitry 38 includes a first control signal generation operational amplifier 68 including a non-inverting input configured to receive the control signal CNT from the temperature signal scaling circuitry 32, an inverting input coupled to ground via a control resistor R_CONT, and an output. The output of the first control signal generation operational amplifier 68 is coupled to a gate contact (G) of a first control signal generation FET Q_CSG1, which further includes a source contact (S) coupled to ground via the control resistor R_CONT and a drain contact (D). A control signal generation current mirror 70 includes a second control signal generation FET Q_CSG2 with a drain contact (D) coupled to the drain contact (D) of the first control signal generation FET Q_CSG1, a gate contact (G) coupled to the drain contact (D), and a source contact (S) coupled to the supply voltage VDD and a third control signal generation FET Q_CSG3 with a source contact (S) coupled to the supply voltage VDD, a gate contact (G) coupled to the gate contact (G) of the second control signal generation FET Q_CSG2, and a drain contact (D).

A second control signal generation operational amplifier 72 includes an inverting input configured to receive a reference voltage, which may be generated by placing the constant current I_CONST over a first control signal generation resistor R_CSG1, a non-inverting input, and an output. A replica shunt FET Q_RSHN1, which may be a fractional size replica of the shunt FET element 24 in the RF attenuator 12 includes a gate contact (G) coupled to the output of the second control signal generation operational amplifier 72, a drain contact (D) coupled to the non-inverting input of the second control signal generation operational amplifier 72, and a source contact (S) coupled to ground via a degeneration resistor R_DG. The gate contact (G) of the replica shunt FET Q_RSHN1 further provides the shunt control signal CNT_SHN to the RF attenuator 12.

A replica T-type attenuator 74, which may be a fractional size replica of the RF attenuator 12, includes a first replica series FET Q_RSER1 with a drain contact (D) coupled to ground via a second control signal generation resistor R_CSG2, a source contact (S) coupled to an intermediate node 78, and a gate contact (G), a second replica series FET Q_RSER2 with a drain contact (D) coupled to the intermediate node 78, a source contact (S), and a gate contact (G), and an additional replica shunt FET Q_RSHN2 with a drain contact (D) coupled to the intermediate node 78, a source contact (S) coupled to ground, and a gate contact (G) coupled to the gate contact (G) of the replica shunt FET Q_RSHN1. A third control signal generation operational amplifier 76 includes a non-inverting input coupled to the source contact (S) of the second replica series FET Q_RSER2 and configured to receive the constant current signal I_CONST, an inverting input coupled to ground via a third control signal generation resistor R_CSG3 and configured to receive the constant current signal I_CONST, and an output coupled to the gate contacts (G) of the first replica series FET Q_RSER1 and the second replica series FET Q_RSER2. Further, the output of the third control signal generation operational amplifier 76 provides the series control signal CNT_SER to the RF attenuator 12.

In operation, the control signal CNT drives the control signal generation current mirror 70 via the first control signal generation FET Q_CSG1 and the first control signal generation operational amplifier 68 to produce a linear current described by $$I\_CONT = \frac{V_{CNT}}{R\_CONT},$$

through me replica shunt FET Q_RSHN1. The second control signal generation operational amplifier 72 maintains the voltage at the drain contact (D) of the replica shunt FET Q_RSHN1 at the reference voltage generated at the inverting terminal of operational amplifier 72 by adjusting the resistance of the replica shunt FET Q_RSHN1 via a signal delivered to the gate contact (G) of the replica shunt FET Q_RSHN1. These circuit blocks comprise a scaled replica shunt FET controlled resistance loop 71. This same control signal is also delivered to the additional replica shunt FET Q_RSHN2 and provides the shunt control signal CNT_SHN. At the same time, the third control signal generation operational amplifier 76 adjusts the impedance of the first replica series FET Q_RSER1 and the second replica series FET Q_RSER2 into a 50Ω termination provided by the second control signal generation resistor R_CSG2 in order to provide the series control signal CNT_SER. These subsequent circuit blocks comprise a scaled replica attenuator input resistance matching loop 73. The control resistor R_CONT may be a discretely adjustable resistor that is adjusted (via a first configuration signal CAL1) during calibration of the configurable RF attenuator circuitry 10 in order to produce a desired relationship between the control signal CNT, which may be indicative of a temperature of the configurable RF attenuator circuitry 10 or another signal such as the test signal TEST, and the attenuation response of the RF attenuator 12. Further, the degeneration resistor R_DG may similarly be a discretely adjustable resistor that is adjusted (via a second configuration signal CAL2) during calibration of the configurable RF attenuator circuitry 10 in order to produce a substantially linear-in-dB relationship between the control signal CNT and the attenuation response of the RF attenuator 12.

As discussed above, conventional linear and/or linear-in-dB RF attenuators have generally been realized only in pi-type configurations, in which the control circuitry necessary to provide a linear-in-dB relationship between a control parameter and an attenuation response is generally easier to implement. The attenuator control signal generation circuitry 38 discussed above generates a second-order polynomial signal at the shunt FET control signal CNT_SHN via the scaled replica shunt FET controlled resistance loop 71, which then creates an appropriate series FET control signal; CNT_SER via the scaled replica attenuator input resistance matching loop 73, resulting in a linear-in-dB relationship between the attenuation response of the RF attenuator 12 and the control signal CNT. Specifically, the drain current of the replica shunt FET Q_RSHN1 is given by Equation (6):

$$I_D = \beta[2(V_{GS} - V_T)V_{DS} - V_{DS}^2] \qquad (6)$$

where $I_D$ is the drain current of the replica shunt FET Q_RSHN1, $V_{GS}$ is the gate-to-source voltage of the replica shunt FET Q_RSHN1, $V_T$ is the threshold voltage of the replica shunt FET Q_RSHN1, $\beta$ is the process parameter of the replica shunt FET Q_RSHN1, and $V_{DS}$ is the drain-to-source voltage of the replica shunt FET Q_RSHN1. Due to Equations (7) and (8) below:

$$V_{GS} = V_{CNT\_SHN} - \left(\frac{V_{CNT}}{R\_CONT}\right)R\_DG \qquad (7)$$

$$V_{DS} = V\_REF - \left(\frac{V_{CNT}}{R\_CONT}\right)R\_DG \qquad (8)$$

where $V_{CNT}$ is the voltage of the control signal CNT and $V_{CNT\_SHN}$ is the voltage generated by the controlled resistance loop 71 at the gate of the replica shunt FET Q_RSHN1. The shunt voltage $V_{CNT\_SHN}$ can be rewritten as shown in Equation (9):

$$V_{CNT\_SHN} = V_T + \left(\frac{R\_DG}{R\_CONT}\right)V_{CNT} + \qquad (9)$$

$$\frac{\left(\frac{1}{\beta R\_CONT}\right)V_{CNT} + \left[V\_REF - \left(\frac{R\_DG}{R\_CONT}\right)V_{CNT}\right]^2}{2\left[V\_REF - \left(\frac{R\_DG}{R\_CONT}\right)V_{CNT}\right]}$$

As shown in Equation (9), the shunt voltage $V_{CNT\_SHN}$ generated at the gate of the replica shunt FET Q_RSHN1 is a second order equation, which when also applied to the gate of the shunt control FET Q_RSHN2 in the scaled replica T attenuator 74 causes the replica attenuator input resistance matching loop 73 to generate an appropriate series control signal CNT_SER. Therefore, the attenuator control signal generation circuitry 38 provides the series control signal CNT_SER and the shunt control signal CNT_SHN such that the attenuation response of the RF attenuator 12 is substantially linear-in-dB with respect to the control signal CNT. In the case that the RF attenuator is a pi-type attenuator, the value of the degeneration resistor R_DG may be set to zero, thereby resulting in a linear shunt voltage $V_{CNT\_SHN}$ as shown in Equation (10):

$$V_{CNT\_SHN} = V_T + \left(\frac{1}{2}\right)V\_REF + \left(\frac{1}{2\beta R\_CONT * V\_REF}\right)V_{CNT} \qquad (10)$$

Notably, the attenuator control signal generation circuitry 38 shown in FIG. 7 is only an exemplary embodiment thereof. Those of ordinary skill in the art will appreciate that the functional objectives of the attenuator control signal generation circuitry 38 may be carried out in any number of ways, all of which are contemplated herein.

Figure 8A:
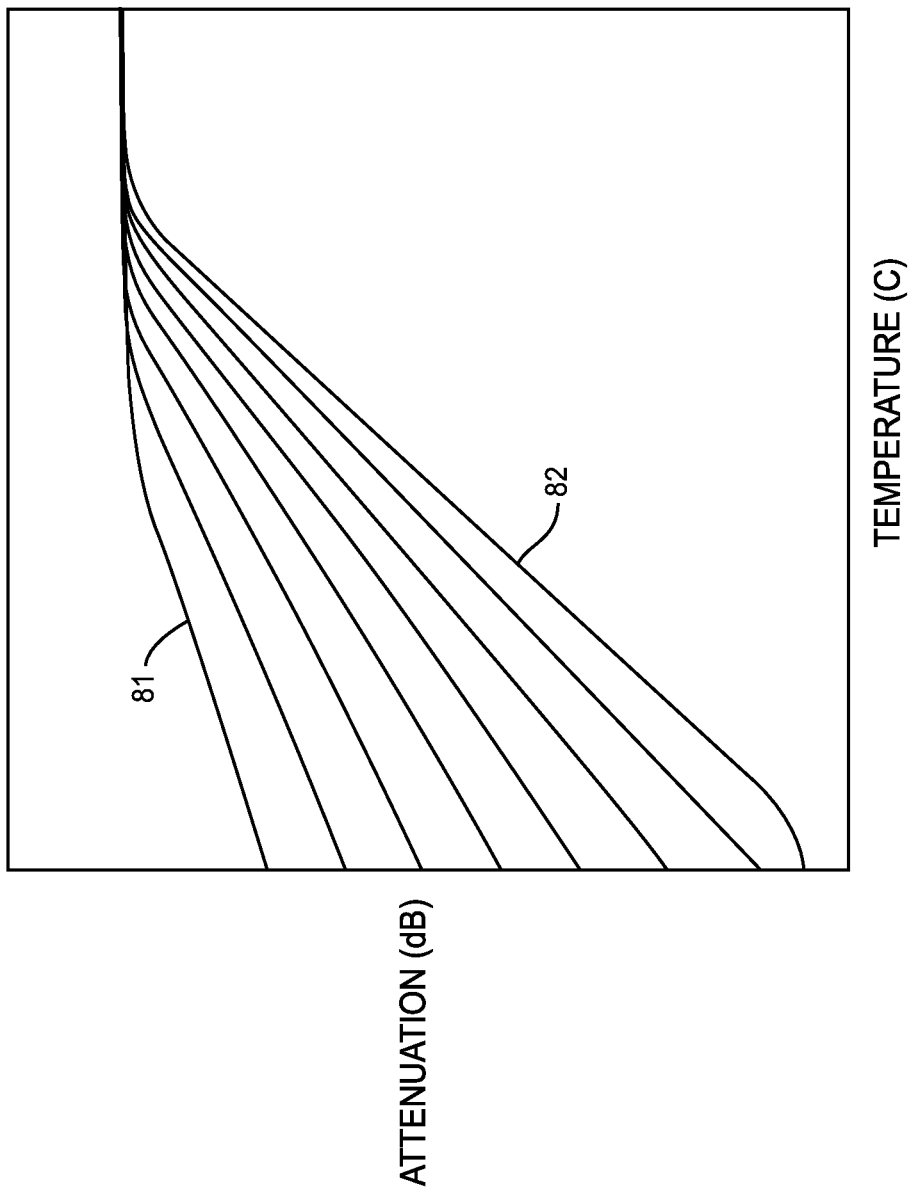
Figure 8B:
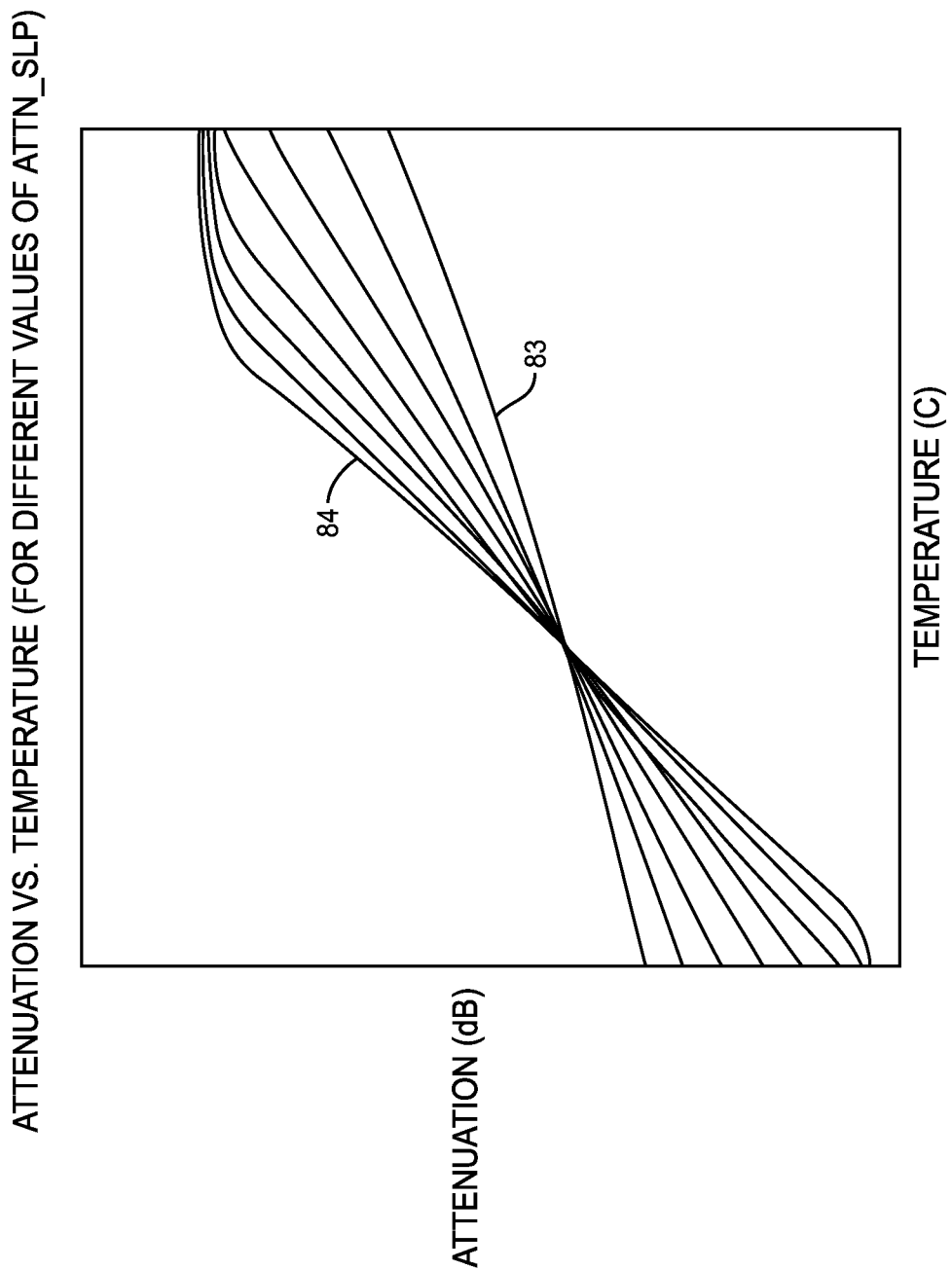

FIGS. 8A through 8D are graphs illustrating the attenuation response of the RF attenuator 12 according to various embodiments of the present disclosure. FIG. 8A illustrates the relationship between the temperature of the configurable RF attenuator circuitry 10 and the attenuation response of the RF attenuator 12 for a variety of values of the attenuation offset control signal ATTN_OFF. As shown in FIG. 8A, the relationship between the temperature of the configurable RF attenuator circuitry 10 and the attenuation response of the RF attenuator 12 is substantially linear-in-dB within the operating range of the RF attenuator 12. Further, the nominal attenuation at any specific temperature of the RF attenuator 12 changes for different values of the attenuation offset control signal ATTN_OFF. Traces 81 and 82 show the attenuation response when ATTN_OFF is set to its minimum and maximum values respectively. FIG. 8B illustrates the relationship between the temperature of the configurable RF attenuator circuitry 10 and the attenuation response of the RF attenuator 12 for a variety of values of the attenuation slope control signal ATTN_SLP. As shown in FIG. 8B, the relationship between the temperature of the configurable RF attenuator circuitry 10 and the attenuation response of the RF attenuator 12 is substantially linear-in-dB within the operating range of the RF attenuator 12. Further, the slope of the relationship between the temperature of the configurable RF attenuator circuitry 10 and the attenuation response of the RF attenuator 12 changes for different values of the attenuation slope control signal ATTN_SLP. Traces 83 and 84 show the attenuation response when ATTN_SLP is set to its minimum and maximum values respectively. FIG. 8C illustrates the relationship between the voltage of the test signal TEST and the attenuation response of the RF attenuator 12 for a variety of values of the attenuation offset control signal ATTN_OFF. As shown in FIG. 8C, the relationship between the voltage of the test signal TEST and the attenuation response of the RF attenuator 12 is substantially linear-in-dB within the operating range of the RF attenuator 12. Further, the nominal attenuation for any specific value of the TEST control signal into the control system 14 for the RF attenuator 12 changes for different values of the attenuation offset control signal ATTN_OFF. Traces 85 and 86 show the attenuation response when ATTN_OFF is set to its minimum and maximum values respectively. FIG. 8D illustrates the relationship between the voltage of the test signal TEST and the attenuation response of the RF attenuator for different values of the attenuation slope control signal ATTN_SLP. As shown in FIG. 8D, the relationship between the voltage of the test signal TEST and the attenuation response of the RF attenuator 12 is substantially linear-in-dB within the operating range of the RF attenuator 12. Further, the slope of the relationship between the voltage of the test signal TEST and the attenuation response of the RF attenuator 12 changes for different values of the attenuation slope control signal ATTN_SLP. Traces 87 and 88 show the attenuation response when ATTN_SLP is set to its minimum and maximum values respectively.

Those skilled in the art will recognize improvements and modifications to the embodiments of the present disclosure. All such improvements and modifications are considered within the scope of the concepts disclosed herein and the claims that follow.

What is claimed is:

1. Circuitry comprising:
    a radio frequency (RF) attenuator configured to provide an attenuation response between an input node and an output node;
    a control system coupled to the RF attenuator and configured to:
        in a first mode of operation, adjust one or more control signals provided to the RF attenuator based on a temperature of the circuitry such that the attenuation response of the RF attenuator is substantially linear-in-dB with respect to the temperature of the circuitry; and
        in a second mode of operation, adjust the one or more control signals provided to the RF attenuator based on a test signal provided to the control system such that the attenuation response of the RF attenuator is substantially linear-in-dB with respect to a magnitude of the test signal.

2. The circuitry of claim 1 wherein the RF attenuator is a T attenuator.

3. The circuitry of claim 2 wherein the RF attenuator comprises:
    a first series field-effect transistor (FET) coupled between the input node and an intermediate node;
    a second series FET coupled between the intermediate node and the output node; and
    a shunt FET coupled between the intermediate node and ground.

4. The circuitry of claim 3 wherein the control system is configured to deliver a series control signal to the first series FET and the second series FET and deliver a shunt control signal to the shunt FET.

5. The circuitry of claim 2 wherein the first series FET, the second series FET, and the shunt FET each comprise a plurality of FETs coupled in series.

6. The circuitry of claim 1 wherein the control system is further configured to receive a number of input parameters and adjust the one or more control signals provided to the RF attenuator based on the input parameters.

7. The circuitry of claim 6 wherein the number of input parameters include a slope parameter and an offset parameter.

8. The circuitry of claim 7 wherein the control system is configured to adjust a slope of the attenuation response of the RF attenuator based on the slope parameter and adjust an offset of the attenuation response of the RF attenuator based on the offset parameter.

9. The circuitry of claim 8 wherein:
the offset parameter is a binary value; and
a magnitude of the attenuation response at a specific nominal temperature of the RF attenuator is adjustable between $2^n$ values, where n is the number of bits in the offset parameter.

10. The circuitry of claim 8 wherein:
the slope parameter is a binary value; and
the slope of the attenuation response of the RF attenuator is adjustable between $2^n$ values, where n is the number of bits in the slope parameter.

11. Circuitry comprising:
a radio frequency (RF) attenuator configured to provide an attenuation response between an input node and an output node; and
a control system coupled to the RF attenuator and configured to:
adjust one or more control signals provided to the RF attenuator with respect to a temperature of the circuitry such that the attenuation response of the RF attenuator is substantially linear-in-dB with respect to temperature; and
receive a test signal and simulate a change in temperature of the circuitry based on the test signal in order to test the attenuation response of the RF attenuator with respect to temperature.

12. The circuitry of claim 11 wherein the RF attenuator is a T attenuator.

13. The circuitry of claim 12 wherein the RF attenuator comprises:
a first series field-effect transistor (FET) coupled between the input node and an intermediate node;
a second series FET coupled between the intermediate node and the output node; and
a shunt FET coupled between the intermediate node and ground.

14. The circuitry of claim 13 wherein the control system is configured to deliver a series control signal to the first series FET and the second series FET and deliver a shunt control signal to the shunt FET.

15. The circuitry of claim 13 wherein the first series FET, the second series FET, and the shunt FET each comprise a plurality of FETs coupled in series.

16. The circuitry of claim 11 wherein the control system is further configured to receive a number of input parameters and adjust the one or more control signals provided to the RF attenuator based on the input parameters.

17. The circuitry of claim 16 wherein the number of input parameters include a slope parameter and an offset parameter.

18. The circuitry of claim 17 wherein the control system is configured to adjust a slope of the attenuation response of the RF attenuator based on the slope parameter and adjust an offset of the attenuation response of the RF attenuator based on the offset parameter.

19. The circuitry of claim 18 wherein:
the offset parameter is a binary value; and
a magnitude of the attenuation response at a specific nominal temperature of the RF attenuator is adjustable between $2^n$ values, where n is the number of bits in the offset parameter.

20. The circuitry of claim 18 wherein:
the slope parameter is a binary value; and
the slope of the attenuation response of the RF attenuator is adjustable between $2^n$ values, where n is the number of bits in the slope parameter.

* * * * *